United States Patent
Khoury

(10) Patent No.: US 6,541,983 B2
(45) Date of Patent: Apr. 1, 2003

(54) METHOD FOR MEASURING FUSE RESISTANCE IN A FUSE ARRAY

(75) Inventor: Elie Georges Khoury, Gilbert, AZ (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/851,964

(22) Filed: May 10, 2001

(65) Prior Publication Data

US 2002/0167323 A1 Nov. 14, 2002

(51) Int. Cl.[7] .............................................. H01H 85/30
(52) U.S. Cl. .................................... 324/550; 325/525
(58) Field of Search ................................. 324/503, 550, 324/525; 365/96, 225.7

(56) References Cited

U.S. PATENT DOCUMENTS

| | | | | |
|---|---|---|---|---|
| 5,210,699 A | * | 5/1993 | Harrington | 716/5 |
| 5,635,854 A | * | 6/1997 | Shimanek et al. | 326/38 |
| 5,731,733 A | * | 3/1998 | Denham | 327/525 |
| 5,991,220 A | * | 11/1999 | Freyman et al. | 365/225.7 |
| 6,185,705 B1 | * | 2/2001 | Cutter et al. | 714/721 |
| 6,205,050 B1 | * | 3/2001 | Tamaki | 365/154 |
| 6,373,762 B2 | * | 4/2002 | Morgan | 365/210 |

* cited by examiner

Primary Examiner—N. Le
Assistant Examiner—Walter Benson
(74) Attorney, Agent, or Firm—Peter Zawilski

(57) ABSTRACT

In a method of measuring fuse resistance in a fuse array, the P-MOS switches used for row address are replaced by a pass-gate device comprising an N-MOS in parallel with a P-MOS, with a close to zero voltage drop. By this means a reduced power source current is applied across the fuse. The voltage drop is measured and the resistance obtained. Thus non-destructive testing is carried out as compared to destructive testing with the prior art method.

13 Claims, 2 Drawing Sheets

METHOD FOR MEASURING FUSE RESISTANCE IN A FUSE ARRAY

This invention relates to a method for measuring fuse resistance in a fuse array; and particular the salicide poly fuse resistance in a fuse array, without a destructive de-layering process.

BACKGROUND OF THE INVENTION

At present, microprobing wafers or dies to measure a salicide poly fuse requires a de-layering process. This is a destructive process and slow at best. Once the top metal layer is removed and the fuses exposed, they can be measured by microprobes. This is a very tedious and slow process. At best, the resistance of only a few fuses can be measured in an hour. The de-layering and microprobing process is a very expensive procedure requiring a lot of engineering time and can be done only once per die, since it is destructive.

SUMMARY OF THE INVENTION

A simple electronics method for measuring the pre and post programming fuse resistance in a fuse array is incorporated into the design of the array. Non-destructive measuring the full resistance can be repeated many times, allowing fuse characterization under differing conditions. The process is extremely fast and is performed on the tester. All fuses in an array can be measured, and characterized. Statistical information can be extracted, and process, temperature and other conditions can be attributed.

Measuring the fuse resistance in a fuse array is the same process as blowing a fuse, but with a much lower current, for example 100 $\mu$A instead of 20 mA. The measured value or aggregate fuse resistance is the resistance of the wires, and the resistance of the devices used to switch the current. With a modification, it is possible to determine the voltage drop across the wires and switches, but not a fuse, giving more accurate measurement.

Broadly, the present invention comprises, positioning a fuse array, arranged in rows and columns, in a tester, the tester having an internal write source, means for controlling the write source, and a low current test source. The procedure includes disabling the internal write source, addressing the fuse array to select a fuse, applying the low current source to the fuse and measuring the voltage of this low current source. The resistance of the fuse is thus obtained. A suitable value for the low current source is between 100 $\mu$A and of 500 $\mu$A.

Using Spice simulation data a higher level of accuracy in resistance values is optionally obtained. To remove errors caused by wire and switch resistances, one fuse can be shorted to provide a datum value for wires and other non-fuse items.

DETAILED DESCRIPTION OF THE PREFERRED EMBODIMENT

Figure 1:
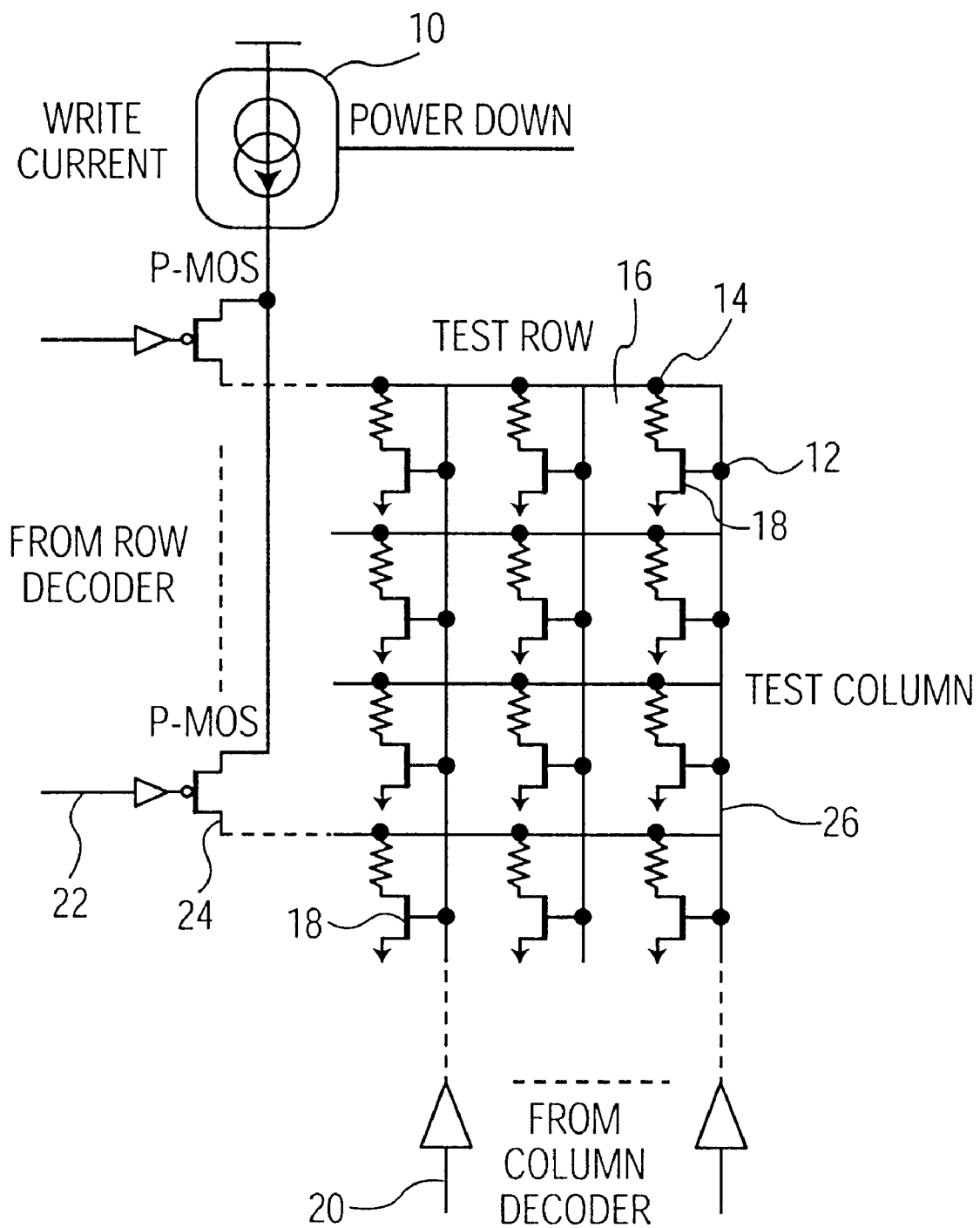
FIG. 1 is a diagrammatic illustration of a known write circuit for blowing fuses in an array.

FIG. 1 illustrates a circuit for blowing fuses, fuse array on a chip indicated generally at 26. Write current is applied at 10 in a tester, and an address selects one row, 12, and one column, 14. At the intersection of a row and a column is a fuse 16 and an N-MOS switch device 18. The column address 20 selects all the N-MOS switch devices 18 in that column, while the row address 22 selects the P-MOS switch device 24 for a particular row.

An electrical path is formed allowing current to flow from the source of the P-MOS switch 22 into the row, into the fuse 16, and then into the drain of the N-MOS switch 18, to ground. This current, in write mode is large, of the order of 20 mA, and is generated by an internal current source, and is sufficient to blow the fuse, subject to any faults in the fuse. The procedure is optionally repeated for different fuses by selecting different rows and columns.

Once tested, then the fuse is blown and thus this testing is typically only a form of quality control, in that it is a destructive process and can therefore only provide an indication of what the fuse resistances are in a production process.

Figure 2:
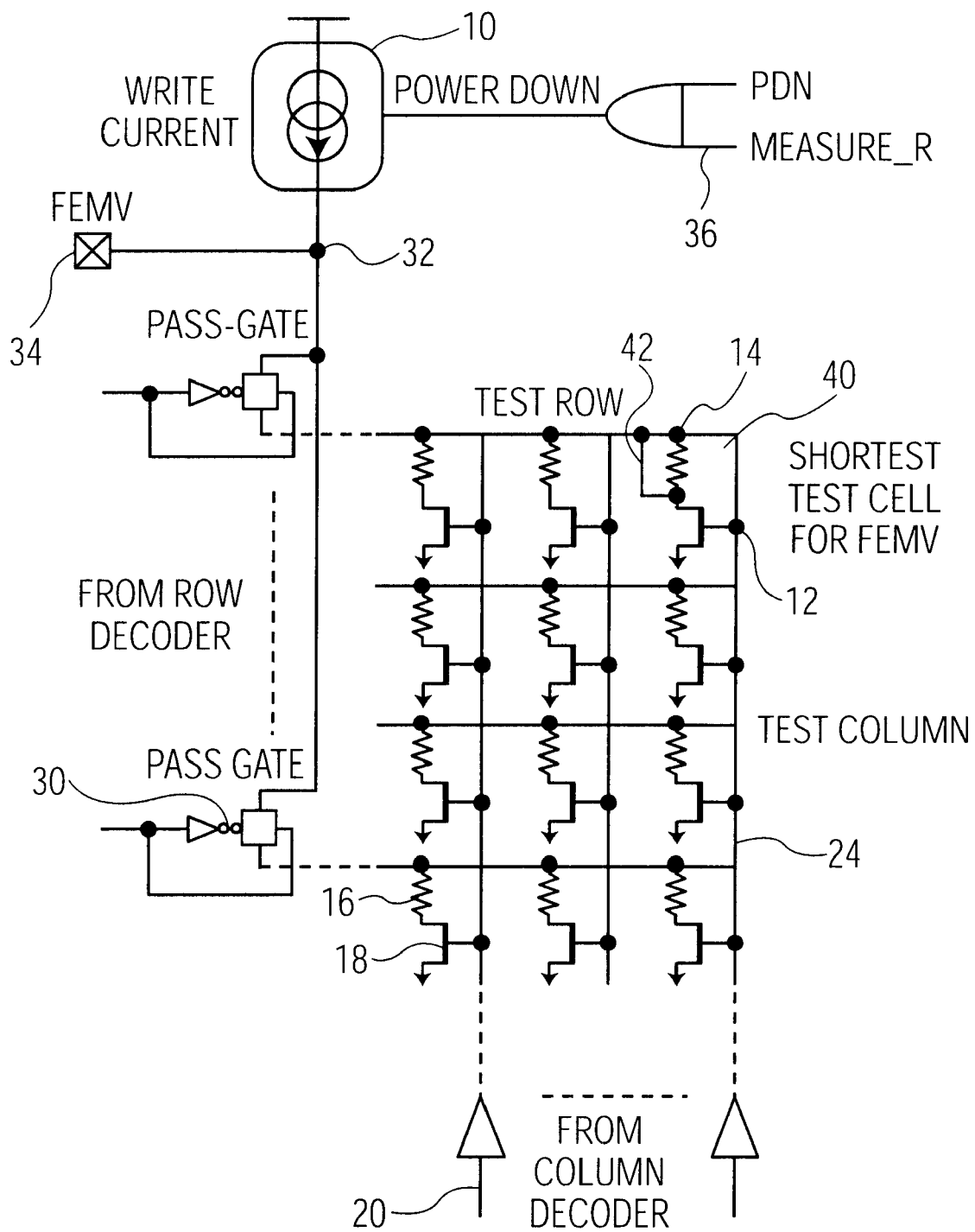
FIG. 2 is a diagrammatic illustration of a write circuit in accordance with the present invention.

FIG. 2 shows a modified circuit, in accordance with the present invention, which allows one fuse to be measured at a time using the write procedure. The P-MOS switch device 22 of FIG. 1 is replaced by a pass-gate device 30—comprising an N-MOS in parallel with a P-MOS device—that has close to zero voltage drop—for example a few millivolts—across its terminals, when the current flowing is small (100 $\mu$A–500 $\mu$A). An intermediate node FCMV (force current measure voltage), 32, between the internal write current source 10 and the terminal of the pass gate is tapped and routed to an analogue pad 34. The write current source Power Down (PDN) signal is gated with a specific signal "Measure-R", at 36, which powers down the write current source only. The chip 24 has a FCMV pin connecting to the FCMV node 32. The tester supplies a low current source at pad 34.

In testing or measuring the resistance of a fuse, the internal, or on chip, write current 10 is turned off or powered down by the R-measure. A typical measuring procedure is as follows:

Start with the normal write (fuse-blowing) procedure. Then disable the internal write current source using the "Measure-R" signal, and then supplying from the tester, at 34, a reduced current, for example 100 $\mu$A to 500 $\mu$A into the FCMV connection 32. Commence a write procedure, that is select a row and a column, and stop after one vector after starting the write procedure. The tester PMV (Processor Measurement Unit) measures the voltage at the FCMV node 32, (at 34). The aggregate resistance of the fuse is:

$$R_{aggregate}=V(fcmv)/I(fcmv)$$

This procedure is optionally repeated for each fuse in the array. In addition to providing an actual resistance value for each fuse 16, the procedure is useful for providing indications of process variations and other possible variables.

This procedure provides a non-destructive method of checking fuse arrays. In the prior art, as the fuses were blown, only an indication of the quality of the manufacturing process could be obtained. With the present invention the actual values of fuses being used can be obtained.

The aggregate resistance is the resistance of the wires, Pass-gate switch and N-MOS switch. As small currents are being used to measure the fuse resistance, the voltage drop across the wires, pass-gates and N-MOS switches is very small—a few millivolts. The error introduced by this voltage drop to the fuse resistance measured for a blown fuse is very small (error <1%), while it is in the order of 10%, or less, for an unblown fuse measurement.

If the fuse characterization is behavioral (i.e., qualitative) such errors can be tolerated. However there are ways to reduce or almost completely eliminate such errors.

Using a simulation application, known and referred to as SPICE, can provide a simulated result for a given PVT (process, voltage and temperature) variation, a minimum, typical and maximum voltage drop across the switches. Using SPICE figures improves the fuse measurement. The final fuse resistance in this case is given by:

$$R_{using\ Spice} = (V(fcvm) - V(Spice\ voltage\ drop))/I(fcvm)$$

This method is fairly accurate but requires knowing the PCM (process control monitor) data of the lot from which the die came, and the SPICE simulated voltage drop across the switches.

A further way is illustrated as an additional feature in FIG. 2. A dynamic evaluation of the voltage drop across all the wires (including contacts and vias), pass-gate and N-MOS switches is accomplished by using one cell in the array as a reference cell for the voltage drop. This reference can be a test cell. In the example in FIG. 2 it is a cell at the intersection of the test column and the test row, indicated at 40. The reference cell 40 has the resistance 16 shorted, at 42.

When a small current is applied through this shorted cell, the total voltage drop measured at the FCMV pin is the voltage drop across the wires and switches but not the fuse. Using this voltage drop will provide an accurate fuse measurement for the rest of the array. The final fuse resistance in this arrangement is given by:

$$R_{using\ shorted\ fuse} = (V(fcmv) - V(shorted\ fuse))/I(fcmv)$$

The present invention enables the actual checking, and measuring, the resistance of a fuse, without destroying it, such fuses afterwards being usable. It is a possibility that the whole process can be automated, being part of a production line, for checking of fuses as a continuous procedure.

Numerous other embodiments may be envisioned without departing from the spirit or scope of the invention.

What is claimed is:

1. A method for measuring an impedance of a fuse located in a fuse array comprising the steps of:

(a) providing a fuse array including at least a conducting path and at least a switching circuit electrically connected thereto, the fuse array arranged in rows columns having each fuse located at an intersection of a row and a column with the fuse array;

(b) positioning the fuse array in a tester having an internal write current source, a control for controlling the internal write current source, a test current source and an output port;

(c) disabling the internal write current source;

(d) supplying a reduced current having a magnitude from said test current source;

(e) starting a write procedure;

(f) stopping said write procedure to address a selected row and a selected column to select a fuse;

(g) applying said reduced current to said selected fuse;

(h) measuring a fuse voltage drop of the reduced current source after having propagated through said selected fuse;

(i) providing a value indicative of a reference voltage drop based on a current having a similar magnitude to the reduced current propagating through the at least a conducting path and the at least a switching circuit similar to those within the fuse array;

(j) determining the impedance of the fuse in dependence upon a difference between the value indicative of the reference voltage drop and the measured fuse voltage drop, as well as the magnitude of the reduced current; and, (k) providing the impedance of the fuse at the output port of the tester.

2. A method according to claim 1, wherein the step of determining the impedance comprises the steps of:

applying said reduced current through the at least a conducting path and the at least a switching circuit;

measuring a reference voltage drop of the reduced current source after having propagated through said at least a conducting path and the at least a switching circuit; and, determining the impedance of the selected fuse using a difference between the measured reference voltage drop and the measured fuse voltage drop, as well as a magnitude of the reduced current.

3. A method according to claim 2, wherein the step of determining the impedance comprises the steps of:

calculating a difference in voltage drop between the measured reference voltage drop and the measured fuse voltage drop;

dividing the calculated difference by the magnitude of the reduced current to obtain the impedance of the selected fuse; and, providing the impedance of the selected fuse to an output port of the tester.

4. A method according to claim 1, wherein the value indicative of the reference voltage drop is determined from spice simulation of a circuit similar to the at least a conducting path and the at least a switching circuit electrically connected thereto.

5. A method according to claim 4, wherein the step of determining a quality comprises the step of:

calculating a difference between the value indicative of the reference voltage drop and the measured fuse voltage drop; and, dividing the calculated difference by the magnitude of the reduced current to obtain the impedance of the selected fuse.

6. A method according to claim 1, comprising the step of:

providing a reference at least a conducting wire and at least a switching circuit electrically connected thereto, wherein the value indicative of the reference at least a conducting path and at least a switching circuit electrically connected thereto.

7. A method according to claim 1, wherein said reduced current from said test current source has a magnitude between 100 $\mu$A and 500 $\mu$A.

8. A method according to claim 1, wherein the absolute impedance of the fuse is measured in Ohms.

9. An apparatus for measuring an impedance of a fuse located at an intersection of a selected row and a selected column within a fuse array comprising:

a circuit for selecting the fuse located at the selected row and the selected column from the fuse array, the circuit having at least a switching circuit and at least a conducting path;

an internal write current source for providing at least one of a write current and a reduced current to the fuse located at the intersection of the selected row and the selected column;

a control circuit for controlling the internal write current source between a write current and a reduced current;

a circuit for determining the impedance of the fuse by using a difference between a voltage drop resulting from the reduced current propagating through said fuse and a value indicative of a reference voltage drop and a magnitude of the reduced current; and, an output port for providing a signal indicative of the impedance of the fuse after determination thereof.

10. An apparatus according to claim 9, comprising a memory location for storing the value indicative of the reference voltage drop.

11. An apparatus according to claim 10, comprising a reference voltage drop measuring circuit, wherein the value indicative of the reference voltage drop is determined from propagating the reduced current through the at least a switching circuit and the at least a conducting path.

12. An apparatus according to claim 11, wherein the circuit for determining the impedance of the fuse comprises:

a subtractor circuit; and, a divider circuit, the subtractor circuit for determining a difference between the voltage drop resulting from the reduced current propagating through said fuse and the reference voltage drop, and the divider for dividing the determined difference by the magnitude of the reduced current in order to determine the impedance of the fuse.

13. An apparatus according to claim 9, wherein the internal write current source is a current source for providing between 100 $\mu$A and 500 $\mu$A.

* * * * *